(12) United States Patent
Kim et al.

(10) Patent No.: US 8,859,342 B2
(45) Date of Patent: Oct. 14, 2014

(54) INTEGRATED CIRCUIT PACKAGING SYSTEM WITH SUBSTRATE MOLD GATE AND METHOD OF MANUFACTURE THEREOF

(75) Inventors: Oh Han Kim, Ichon-si (KR); Haengcheol Choi, Ichon-si (KR); KyungOe Kim, Daejeon (KR)

(73) Assignee: STATS ChipPAC Ltd., Singapore (SG)

( * ) Notice: Subject to any disclaimer, the term of this patent is extended or adjusted under 35 U.S.C. 154(b) by 213 days.

(21) Appl. No.: 13/325,395

(22) Filed: Dec. 14, 2011

(65) Prior Publication Data
US 2013/0154079 A1 Jun. 20, 2013

(51) Int. Cl.
*H01L 21/00* (2006.01)
(52) U.S. Cl.
USPC ............ 438/127; 438/106; 438/125; 438/126
(58) Field of Classification Search
USPC ................... 257/787, 788; 438/106, 125–127
See application file for complete search history.

(56) References Cited

U.S. PATENT DOCUMENTS

| | | | |
|---|---|---|---|
| 5,542,171 A | 8/1996 | Juskey et al. | |
| 5,780,933 A | 7/1998 | Ohmori et al. | |
| 5,981,873 A | 11/1999 | Heo | |
| 6,083,775 A | 7/2000 | Huang et al. | |
| 6,392,425 B1 * | 5/2002 | Chen et al. | 324/756.05 |
| 6,404,069 B2 * | 6/2002 | Wensel | 257/787 |
| 6,432,751 B1 | 8/2002 | Haji | |
| 6,627,976 B1 * | 9/2003 | Chung et al. | 257/666 |
| 6,632,704 B2 | 10/2003 | Kumamoto et al. | |
| 2007/0224729 A1 * | 9/2007 | Reiss et al. | 438/106 |
| 2007/0287228 A1 * | 12/2007 | Chai et al. | 438/109 |
| 2009/0294947 A1 * | 12/2009 | Tain et al. | 257/686 |
| 2010/0038780 A1 * | 2/2010 | Daubenspeck et al. | 257/738 |

FOREIGN PATENT DOCUMENTS

KR  1020090081038 A  7/2009

* cited by examiner

*Primary Examiner* — Jae Lee
(74) *Attorney, Agent, or Firm* — Ishimaru & Associates LLP

(57) ABSTRACT

A method of manufacture of an integrated circuit packaging system includes: providing a substrate; forming a mold gate on an upper surface of the substrate; mounting an integrated circuit to the substrate; and forming an encapsulant encapsulating the integrated circuit, the encapsulant having disruption patterns emanating from the mold gate and underneath a bottom plane of the integrated circuit.

10 Claims, 6 Drawing Sheets

INTEGRATED CIRCUIT PACKAGING SYSTEM WITH SUBSTRATE MOLD GATE AND METHOD OF MANUFACTURE THEREOF

TECHNICAL FIELD

The present invention relates generally to an integrated circuit packaging system and more particularly to a system for utilizing an encapsulant with an integrated circuit in an integrated circuit packaging system.

BACKGROUND

The rapidly growing market for portable electronic devices, e.g. cellular phones, laptop computers, and personal digital assistants (PDAs), is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a substrate; forming a mold gate on an upper surface of the substrate; mounting an integrated circuit to the substrate; and forming an encapsulant encapsulating the integrated circuit, the encapsulant having disruption patterns emanating from the mold gate and underneath a bottom plane of the integrated circuit.

The present invention provides an integrated circuit packaging system, including: a substrate; a mold gate formed on an upper surface of the substrate; an integrated circuit mounted to the substrate; and an encapsulant encapsulating the integrated circuit and having disruption patterns emanating from the mold gate and underneath a bottom plane of the integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
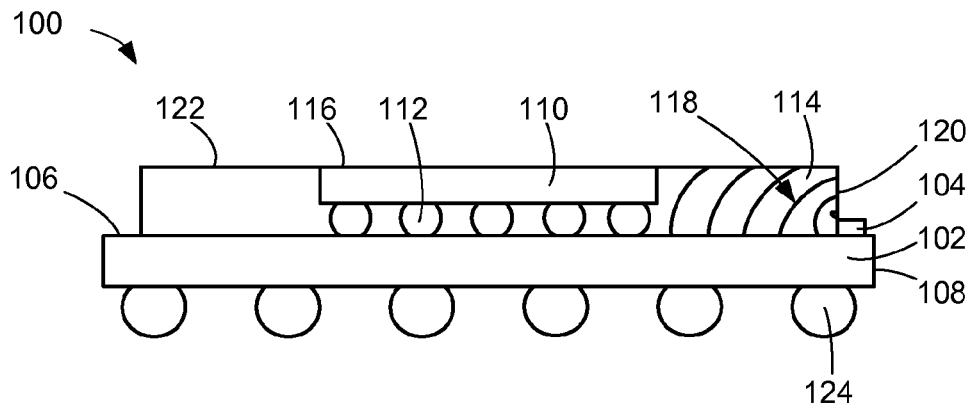
FIG. 1 is a cross-sectional view of an integrated circuit packaging system along the line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements without having any intervening material. The term "processing" as used herein includes deposition of material or photoresist, patterning, exposure, development, etching, cleaning, and/or removal of the material or photoresist as required in forming a described structure.

Figure 2:
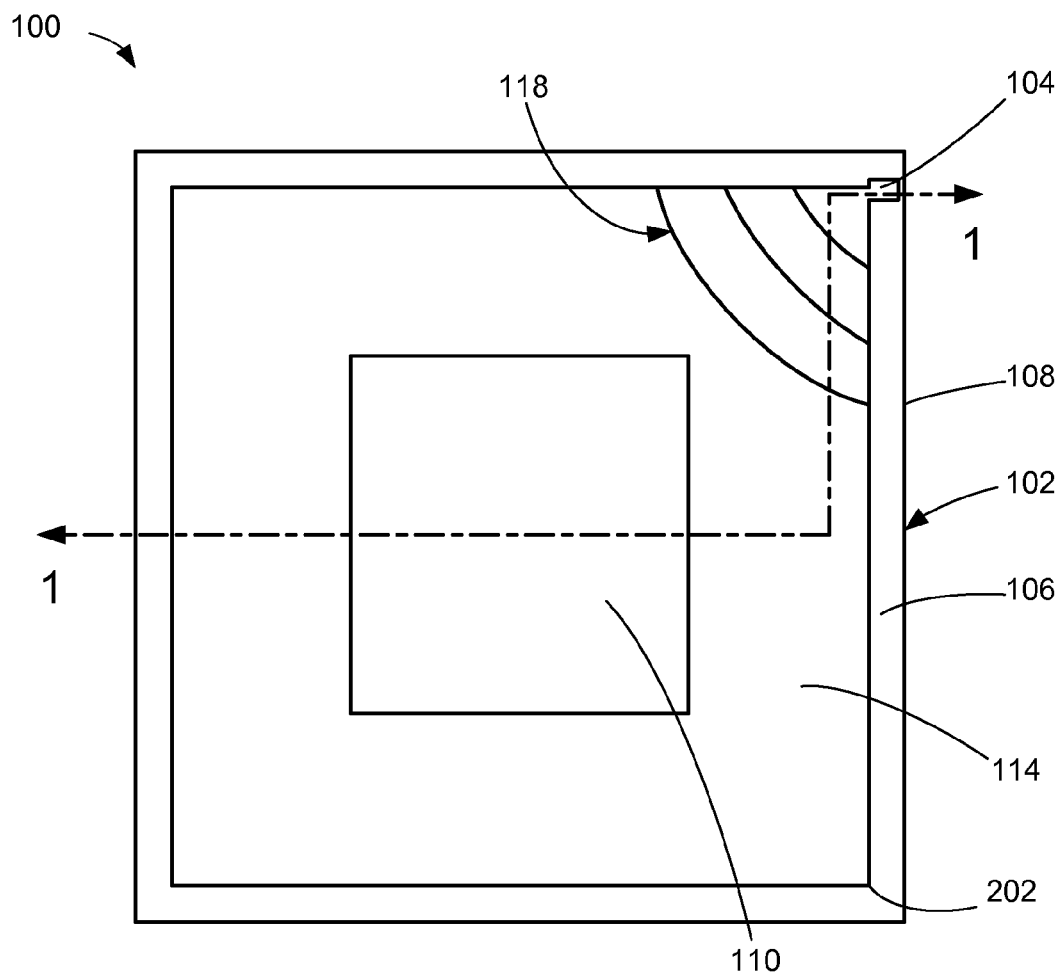
FIG. 2 is a top view of the integrated circuit packaging system of FIG. 1.

Referring now to FIG. 1, therein is shown a cross-sectional view of an integrated circuit packaging system 100 along the line 1-1 of FIG. 2 in a first embodiment of the present invention. The integrated circuit packaging system 100 can be shown having a substrate 102. The substrate 102 is defined as a singulated structure capable of electrical connection, signal routing with internal signal to signal isolation, and providing structural support for components to be mounted thereto. The substrate 102 can be but is not limited to laminated plastic or ceramic.

A mold gate 104 can be formed on an upper surface 106 of the substrate 102. The mold gate 104 can be situated on the upper surface 106 and set back from a vertical side 108 of the substrate 102. The mold gate 104 does not extend past a perimeter of the substrate 102. A portion of the upper surface 106 can be exposed from the mold gate 104 between the mold gate 104 and the vertical side 108.

An integrated circuit 110 having an active side 111, can be mounted to the upper surface 106 of the substrate 102. The active side 111 is defined as a surface having active circuitry fabricated thereon. The integrated circuit 110 can be a flip-chip with interconnects 112 electrically connecting between the integrated circuit 110 and the substrate 102. The interconnects 112 can be a ball grid array, an array of conductive pillars, or asymmetrically arranged conductors.

An encapsulant 114 can be formed on the upper surface 106 of the substrate 102. The encapsulant 114 is defined as a structure that protects sensitive components from moisture, dust and other contamination providing a hermetic seal. The encapsulant 114 can encapsulate the interconnects 112 under the integrated circuit 110 and encapsulate the integrated circuit 110 leaving a top surface 116 exposed.

The encapsulant 114 can include physical characteristics of disruption patterns 118. The disruption patterns 118 can be physical characteristics of the encapsulant 114 formed by density differences in the encapsulant 114 or from grain alignment of the encapsulant 114. The disruption patterns 118 can expand toward the integrated circuit from the mold gate 104 with progressively larger diameters.

The encapsulant 114 can have a flat vertical side 120 extending from a top side 122 of the encapsulant 114 to the upper surface 106 of the substrate 102. The mold gate 104 can be flush with the flat vertical side 120 of the encapsulant 114. The encapsulant 114 can encapsulate around the interconnects 112 and directly injected to and under the integrated circuit 110 and enables transfer molding of the interconnects 112 through the mold gate 104.

For example, utilizing the encapsulant 114 with the mold gate 104 to horizontally encapsulate the integrated circuit 110 and the interconnects 112 is a critical factor in producing the unexpected beneficial results of significantly reduced warpage. Warpage was discovered to unexpectedly drop from a coplanarity measurement of 237 microns to a coplanarity measurement of 70 microns.

Reduced warpage enables the utilization, for example, of the encapsulant 114 and the mold gate 104 with 65 and 45 nanometer technology with the integrated circuit 110 die sizes of 18×18 to 24×24 mm. Further the thickness of the integrated circuit 110 can be reduced enabling 400 or 200 um thicknesses with better electrical performance, the interconnects 112 can be lead free, the encapsulant 114 compound can be a high dielectric constant molding compound (Hi-K EMC), the substrate 102 can be a 3-2-3/4-2-4 ABF BU, and the integrated circuit packaging system 100 can be 40×40 to 55×55 mm.

It has been discovered that utilizing the encapsulant 114 with the mold gate 104 to horizontally encapsulate the integrated circuit 110 and the interconnects 112 is a critical factor in producing the unexpected beneficial results of significantly reduced warpage. It has further been discovered that utilizing the encapsulant 114 with the mold gate 104 to encapsulate the integrated circuit 110 and the interconnects 112 is a critical factor in producing the unexpected results of significantly higher performance by reducing under-fill voids, die cracks, layer delamination, the interconnects 112 cracks or delamination, and under-fill interference ultimately reducing cost of production.

It has been yet further discovered that the side horizontal injection of the encapsulant 114 utilizing the mold gate 104 and producing the disruption patterns 118, decreases mechanical stress during the molding process and increases thermal performance by changing the profile of the integrated circuit packaging system 100. This further increases the performance and reduces defects by providing the encapsulant 114 flow-ability through the interconnects 112 and around the integrated circuit 110.

External interconnects 124 are connected below the substrate 102. The mold gate 104 can correlate to an orientation or layout of the external interconnects 124.

Referring now to FIG. 2, therein is shown a top view of the integrated circuit packaging system 100 of FIG. 1. The integrated circuit packaging system 100 can be shown having the substrate 102 with the mold gate 104 on the upper surface 106. The encapsulant 114 can be shown on the upper surface 106 of the substrate 102 with the integrated circuit 110 exposed from the encapsulant 114.

The disruption patterns 118 are depicted as progressively larger concentric patterns expanding from the mold gate 104. The mold gate 104 can encompass a corner 202 of the encapsulant 114 and extend beyond the perimeter of the encapsulant 114 in two axes.

The upper surface 106 of the substrate 102 can be exposed from the mold gate 104 and surrounding the mold gate 104. The mold gate 104 can be set apart from the vertical side 108 of the substrate 102.

Figure 3:
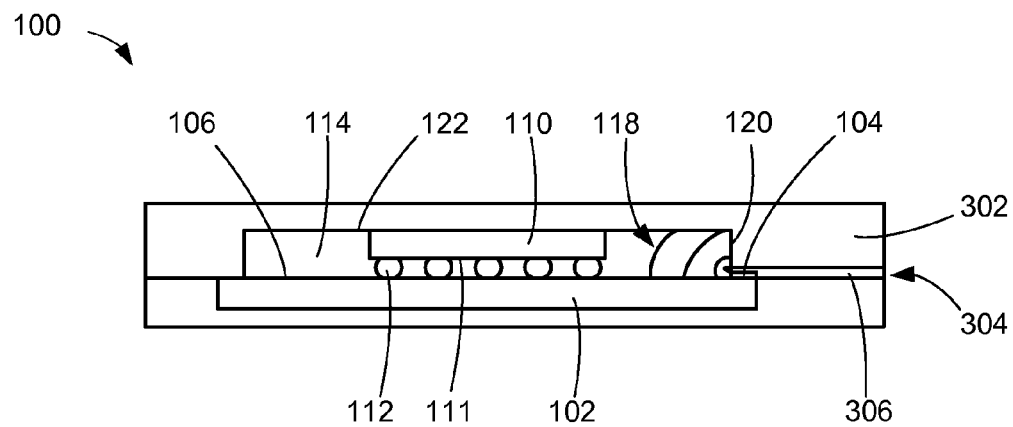
FIG. 3 is a cross-sectional view of the integrated circuit packaging system of FIG. 2 in an encapsulating phase of manufacture.

Referring now to FIG. 3, therein is shown a cross-sectional view of the integrated circuit packaging system 100 of FIG. 2 in an encapsulating phase of manufacture. The integrated circuit packaging system 100 can be shown having a mold chase 302 fully surrounding the substrate 102, the integrated circuit 110, and the mold gate 104. The mold chase 302 can be in direct contact with the integrated circuit 110 and the substrate 102.

The encapsulant 114 can be formed within the mold chase 302 and surrounding the interconnects 112 and the integrated circuit 110 on the upper surface 106 of the substrate 102. The encapsulant 114 can have the disruption patterns 118 emanating from only underneath a bottom plane of the integrated circuit 110 and above the mold gate 104 and from the bottom of the encapsulant 114 to the top side 122 of the encapsulant 114 and toward the integrated circuit 110. The mold chase 302 can have an injection port 304 for horizontal injection of the encapsulant 114 into the mold chase 302 over the substrate 102. The injection port 304 aligns with the mold gate 104 and injects the encapsulant 114 at a height less than the height of the interconnects 112. Injecting the encapsulant 114 at a level under the integrated circuit 110 is critical to producing the unexpected results of decreased warpage and mechanical stress during encapsulant.

The mold gate 104 can restrict, form, and change the flow of the encapsulant 114 into the mold chase 302 and can significantly reduce the mechanical stress and warpage of the integrated circuit packaging system 100 during formation of the encapsulant 114. The mold gate 104 can also be used to determine the proper amount of pressure that the encapsulant 114 is at when the encapsulant 114 covers the integrated circuit 110. A runner 306 can be formed in the injection port 304 over the mold gate 104 and in direct contact with the encapsulant 114. The runner 306 can be attached to the encapsulant 114.

When the mold chase 302 is removed the runner 306 will remain. It has been discovered that utilizing the mold gate 104 unexpectedly allows the runner 306 to be removed over the mold gate 104 without damaging the encapsulant 114 or causing delamination of the encapsulant 114 from the substrate 102. Further, it has been discovered that the use of the mold gate 104 during removal of the runner 306 can leave the encapsulant 114 having the flat vertical side 120 with no loss or residual from the runner 306, and no cracks on the substrate 102 at the mold gate 104. Lastly, it has been discovered that utilizing the mold gate 104 on the substrate 102 unexpectedly minimizes optimization time regardless of the type of the mold chase 302 used.

Figure 4:
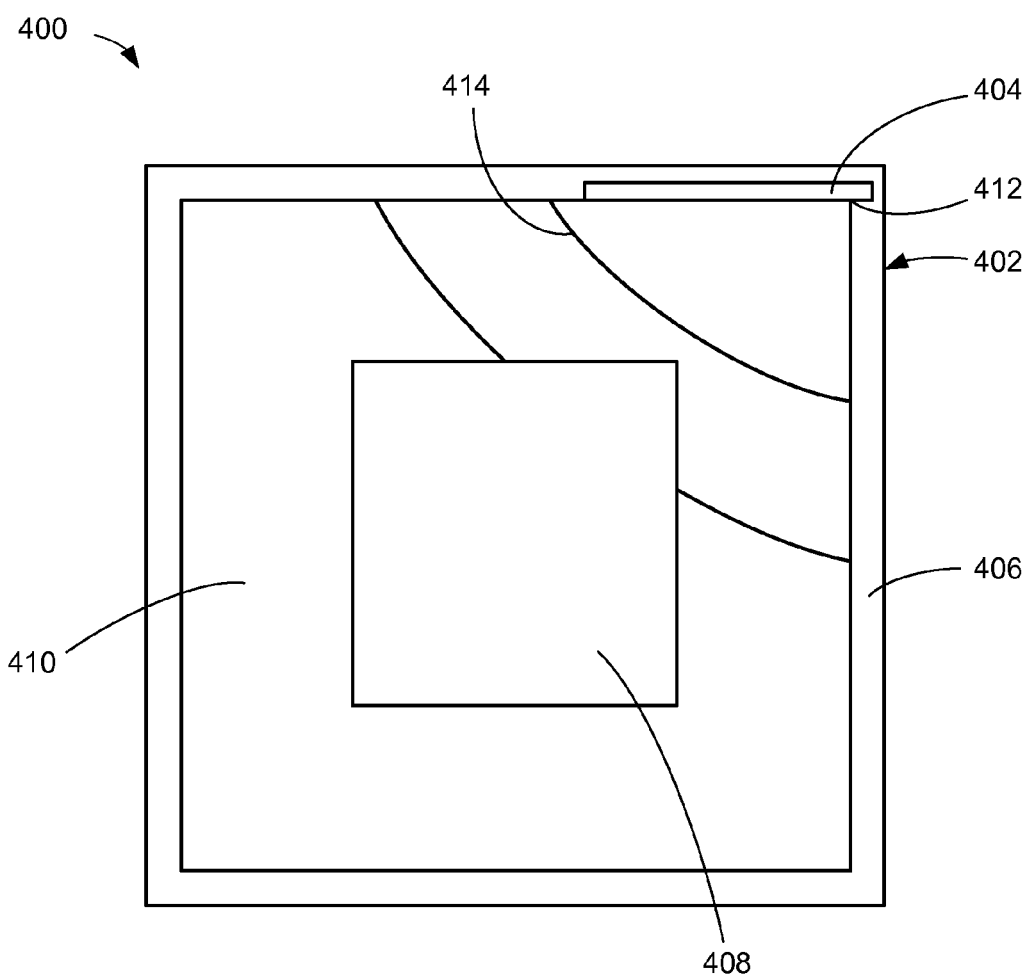
FIG. 4 is a top view of an integrated circuit packaging system in a second embodiment of the present invention.

Referring now to FIG. 4, therein is shown a top view of an integrated circuit packaging system 400 in a second embodiment of the present invention. The integrated circuit packaging system 400 can be shown having a substrate 402. The substrate 402 is defined as a structure capable of electrical connection, signal routing with internal signal to signal isolation, and providing structural support for components to be mounted thereto. The substrate 402 can be but is not limited to laminated plastic or ceramic.

A mold gate 404 can be formed on an upper surface 406 of the substrate 402. The mold gate 404 can have an elongated shape and can be set apart from a perimeter of the substrate 402 leaving portions of the upper surface 406 exposed between the mold gate 404 and the perimeter of the substrate 402.

An integrated circuit 408 can be mounted to the substrate 402. The integrated circuit 408 can be a flip-chip with interconnects (Not Shown) electrically connecting between the integrated circuit 408 and the substrate 402.

Encapsulating the integrated circuit 408 can be an encapsulant 410. The encapsulant 410 is defined as a structure that protects sensitive components from moisture, dust and other contamination providing a hermetic seal, such as a molding compound. The mold gate 404 can be in direct contact with a single side of the encapsulant 410 and extend beyond a corner 412 of the encapsulant 410.

The encapsulant 410 can have disruption patterns 414 formed by the interaction of the mold gate 404, the integrated circuit 408, and the substrate 402. The disruption patterns 414 can be physical characteristics of the encapsulant 410 formed by density differences in the encapsulant 410 or from grain alignment of the encapsulant 410. The disruption patterns 414 can expand from the mold gate 404 at the corner 412 and a side of the encapsulant 410, toward the integrated circuit 408 with progressively larger diameters. The disruption patterns 414 are elongated due to the elongated shape of the mold gate 404.

For example, utilizing the encapsulant 410 with the mold gate 404 to horizontally encapsulate the integrated circuit 408 is a critical factor in producing the unexpected beneficial results of significantly reduced warpage. Warpage was discovered to unexpectedly drop from a coplanarity measurement of 237 microns, on a conventionally molded package, to a coplanarity measurement of 70 microns on the integrated circuit packaging system 400.

Reduced warpage enables the utilization of the encapsulant 410 and the mold gate 404 with 65 and 45 nanometer technology with the integrated circuit 408 die sizes of 18×18 to 24×24 mm. Further the thickness of the integrated circuit 408 can be reduced enabling 400 or 200 um thicknesses with better electrical performance, the encapsulant 410 compound can be a high dielectric constant molding compound (Hi-K EMC), the substrate 402 can be a 3-2-3/4-2-4 ABF BU, and the integrated circuit packaging system 400 dimensions can be 40×40 to 55×55 mm.

It has been discovered that utilizing the encapsulant 410 with the mold gate 404 to horizontally encapsulate the integrated circuit 408 is a critical factor in producing the unexpected results of significantly reduced warpage. It has further been discovered that utilizing the encapsulant 410 with the mold gate 404 to horizontally encapsulate the integrated circuit 408 is a critical factor in producing the unexpected results of significantly higher performance by reducing under-fill voids, die cracks, layer delamination, and under-fill interference ultimately reducing cost of production.

It has been yet further discovered that the side horizontal injection of the encapsulant 410 utilizing the mold gate 404 and producing the disruption patterns 414, decreases mechanical stress during the molding process and increases thermal performance by changing the profile of the integrated circuit packaging system 400. This further increases the performance and reduces defects by providing the encapsulant 410 flow-ability around the integrated circuit 408.

Figure 5:
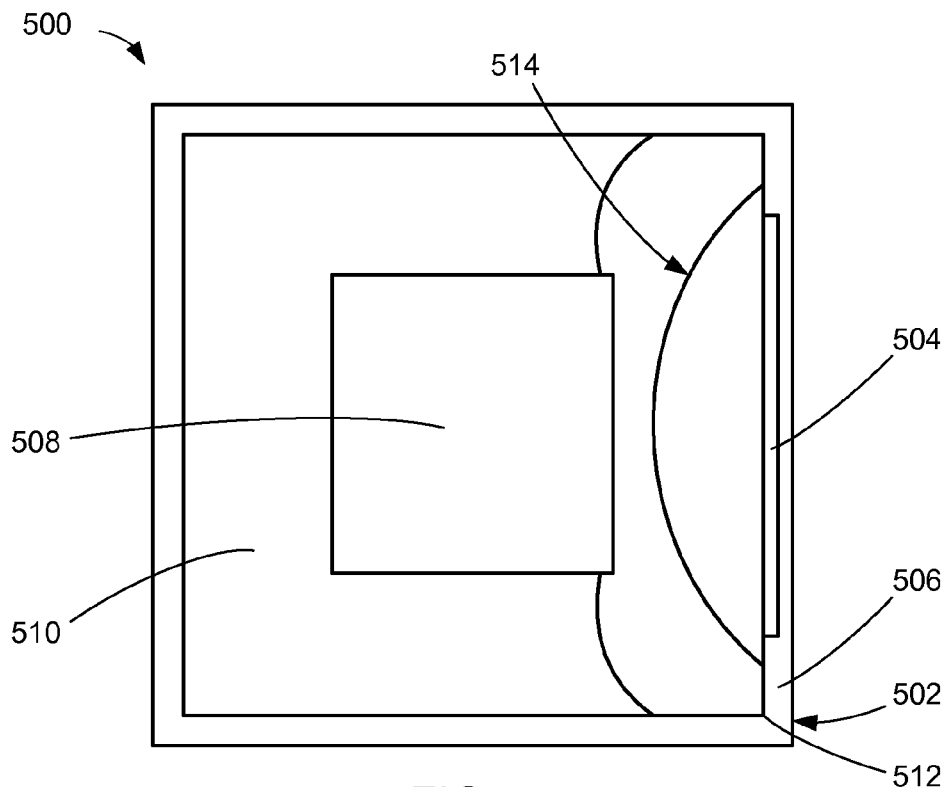
FIG. 5 is a top view of an integrated circuit packaging system in a third embodiment of the present invention.

Referring now to FIG. 5, therein is shown a top view of an integrated circuit packaging system 500 in a third embodiment of the present invention. The integrated circuit packaging system 500 can be shown having a substrate 502. The substrate 502 is defined as a structure capable of electrical connection, signal routing with internal signal to signal isolation, and providing structural support for components to be mounted thereto. The substrate 502 can be but is not limited to laminated plastic or ceramic.

A mold gate 504 can be formed on an upper surface 506 of the substrate 502. The mold gate 504 can have an elongated shape and can be set apart from a perimeter of the substrate 502 leaving portions of the upper surface 506 exposed between the mold gate 504 and the perimeter of the substrate 502.

An integrated circuit 508 can be mounted to the substrate 502. The integrated circuit 508 can be a flip-chip with interconnects (Not Shown) electrically connecting between the integrated circuit 508 and the substrate 502.

Encapsulating the integrated circuit 508 can be an encapsulant 510. The encapsulant 510 is defined as a structure that protects sensitive components from moisture, dust and other contamination providing a hermetic seal. The mold gate 504 can be in direct contact with a single side of the encapsulant 510 and not beyond a corner 512 of the encapsulant 510.

The encapsulant 510 can have disruption patterns 514 formed by the interaction of the mold gate 504, the integrated circuit 508, and the substrate 502. The disruption patterns 514 can be physical characteristics of the encapsulant 510 formed by density differences in the encapsulant 510 or from grain alignment of the encapsulant 510. The disruption patterns 514 can expand from the mold gate 504 at a side of the encapsulant 510, toward the integrated circuit 508 with progressively larger diameters. The disruption patterns 514 are elongated due to the elongated shape of the mold gate 504.

For example, utilizing the encapsulant 510 with the mold gate 504 to horizontally encapsulate the integrated circuit 508 is a critical factor in producing the unexpected results of significantly reduced warpage. Warpage was discovered to unexpectedly drop from a coplanarity measurement of 237 microns, on a conventionally molded package, to a coplanarity measurement of 70 microns on the integrated circuit packaging system 500.

Reduced warpage enables the utilization of the encapsulant 510 and the mold gate 504 with 65 and 45 nanometer technology with the integrated circuit 508 die sizes of 18×18 to 24×24 mm. Further the thickness of the integrated circuit 508 can be reduced enabling 400 or 200 um thicknesses with better electrical performance, the encapsulant 510 compound can be a high dielectric constant molding compound (Hi-K EMC), the substrate 502 can be a 3-2-3/4-2-4 ABF BU, and the integrated circuit packaging system 500 dimensions can be 40×40 to 55×55 mm.

It has been discovered that utilizing the encapsulant 510 with the mold gate 504 to horizontally encapsulate the integrated circuit 508 is a critical factor in producing the unexpected results of significantly reduced warpage. It has further been discovered that utilizing the encapsulant 510 with the mold gate 504 to horizontally encapsulate the integrated circuit 508 is a critical factor in producing the unexpected results of significantly higher performance by reducing under-fill voids, die cracks, layer delamination, and under-fill interference ultimately reducing cost of production.

It has been yet further discovered that the side horizontal injection of the encapsulant 510 utilizing the mold gate 504 and producing the disruption patterns 514, decreases mechanical stress during the molding process and increases thermal performance by changing the profile of the integrated circuit packaging system 500. This further increases the performance and reduces defects by providing the encapsulant 510 flow-ability around the integrated circuit 508.

Figure 6:
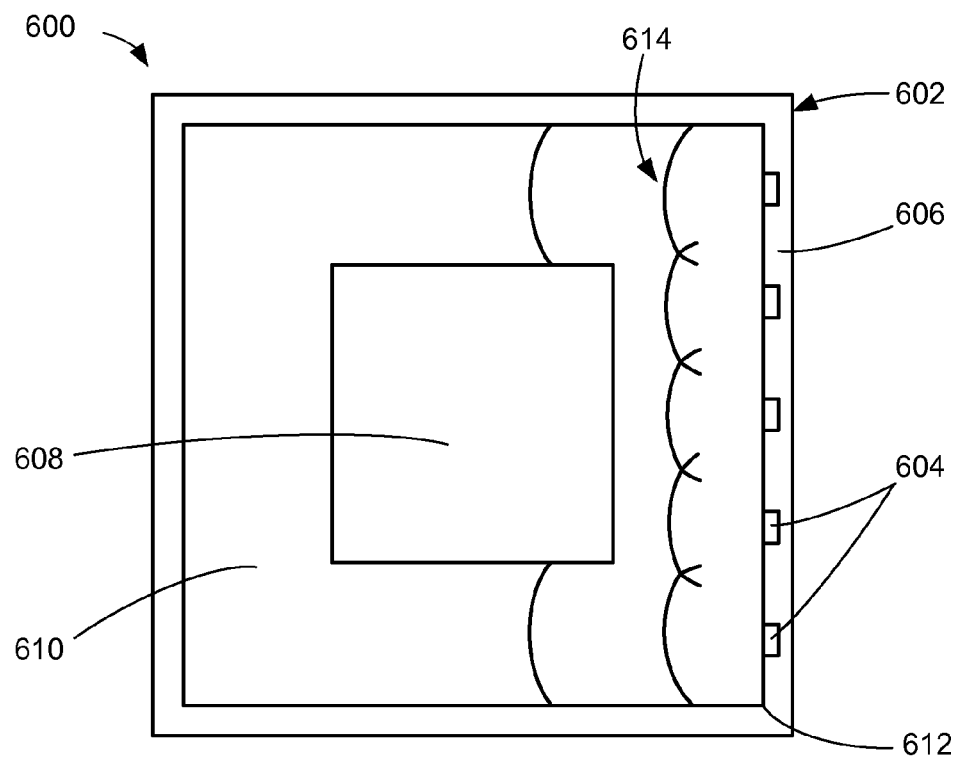
FIG. 6 is a top view of an integrated circuit packaging system in a fourth embodiment of the present invention.

Referring now to FIG. 6, therein is shown a top view of an integrated circuit packaging system 600 in a fourth embodiment of the present invention. The integrated circuit packaging system 600 can be shown having a substrate 602. The substrate 602 is defined as a structure capable of electrical connection, signal routing with internal signal to signal isolation, and providing structural support for components to be mounted thereto. The substrate 602 can be but is not limited to laminated plastic or ceramic.

Mold gates 604 can be formed on an upper surface 606 of the substrate 602. The mold gates 604 can have multiple rectangular shapes and can be set apart from a perimeter of the substrate 602 leaving portions of the upper surface 606 exposed between the mold gates 604 and the perimeter of the substrate 602.

An integrated circuit 608 can be mounted to the substrate 602. The integrated circuit 608 can be a flip-chip with interconnects (Not Shown) electrically connecting between the integrated circuit 608 and the substrate 602.

Encapsulating the integrated circuit 608 can be an encapsulant 610. The encapsulant 610 is defined as a structure that protects sensitive components from moisture, dust and other contamination providing a hermetic seal. The mold gates 604 can be in direct contact with a single side of the encapsulant 610 and not beyond a corner 612 of the encapsulant 610.

The encapsulant 610 can have disruption patterns 614 formed by the interaction of the mold gates 604, the integrated circuit 608, and the substrate 602. The disruption patterns 614 can be physical characteristics of the encapsulant 610 formed by density differences in the encapsulant 610 or from grain alignment of the encapsulant 610. The disruption patterns 614 can expand overlapping from the mold gates 604 at a side of the encapsulant 610, toward the integrated circuit 608 with progressively larger diameters. The disruption patterns 614 are overlapping due to the plurality of the mold gates 604.

For example, utilizing the encapsulant 610 with the mold gates 604 to horizontally encapsulate the integrated circuit 608 is a critical factor in producing the unexpected results of significantly reduced warpage. Warpage was discovered to unexpectedly drop from a coplanarity measurement of 237 microns, on a conventionally molded package, to a coplanarity measurement of 70 microns on the integrated circuit packaging system 600.

Reduced warpage enables the utilization of the encapsulant 610 and the mold gates 604 with 65 and 45 nanometer technology with the integrated circuit 608 die sizes of 18×18 to 24×24 mm. Further the thickness of the integrated circuit 608 can be reduced enabling 400 or 200 um thicknesses with better electrical performance, the encapsulant 610 compound can be a high dielectric constant molding compound (Hi-K EMC), the substrate 602 can be a 3-2-3/4-2-4 ABF BU, and the integrated circuit packaging system 600 dimensions can be 40×40 to 55×55 mm.

It has been discovered that utilizing the encapsulant 610 with the mold gates 604 to horizontally encapsulate the integrated circuit 608 is a critical factor in producing the unexpected results of significantly reduced warpage. It has further been discovered that utilizing the encapsulant 610 with the mold gates 604 to horizontally encapsulate the integrated circuit 608 is a critical factor in producing the unexpected results of significantly higher performance by reducing under-fill voids, die cracks, layer delamination, and under-fill interference ultimately reducing cost of production.

It has been yet further discovered that the side horizontal injection of the encapsulant 610 utilizing the mold gates 604 and producing the disruption patterns 614, decreases mechanical stress during the molding process and increases thermal performance by changing the profile of the integrated circuit packaging system 600. This further increases the performance and reduces defects by providing the encapsulant 610 flow-ability around the integrated circuit 608.

Figure 7:
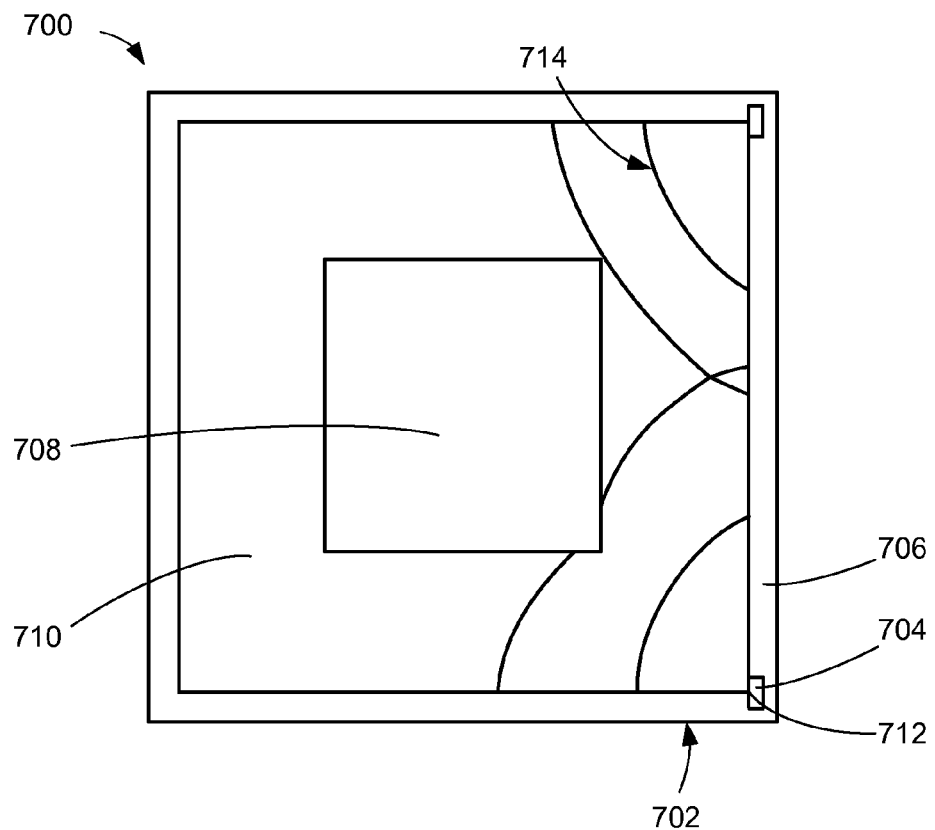
FIG. 7 is a top view of an integrated circuit packaging system in a fifth embodiment of the present invention.

Referring now to FIG. 7, therein is shown a top view of an integrated circuit packaging system 700 in a fifth embodiment of the present invention. The integrated circuit packaging system 700 can be shown having a substrate 702. The substrate 702 is defined as a structure capable of electrical connection, signal routing with internal signal to signal isolation, and providing structural support for components to be mounted thereto. The substrate 702 can be but is not limited to laminated plastic or ceramic.

Mold gates 704 can be formed on an upper surface 706 of the substrate 702. The mold gates 704 can have multiple rectangular shapes and can be set apart from a perimeter of the substrate 702 leaving portions of the upper surface 706 exposed between the mold gates 704 and the perimeter of the substrate 702.

An integrated circuit 708 can be mounted to the substrate 702. The integrated circuit 708 can be a flip-chip with interconnects (Not Shown) electrically connecting between the integrated circuit 708 and the substrate 702.

Encapsulating the integrated circuit 708 can be an encapsulant 710. The encapsulant 710 is defined as a structure that protects sensitive components from moisture, dust and other contamination providing a hermetic seal. The mold gates 704 can be in direct contact with a single side of the encapsulant 710 and beyond multiple corners 712 of the encapsulant 710.

The encapsulant 710 can have disruption patterns 714 formed by the interaction of the mold gates 704, the integrated circuit 708, and the substrate 702. The disruption patterns 714 can be physical characteristics of the encapsulant 710 formed by density differences in the encapsulant 710 or from grain alignment of the encapsulant 710. The disruption patterns 714 can expand overlapping from the mold gates 704 at the corners 712 and a side of the encapsulant 710, toward the integrated circuit 708 with progressively larger diameters. The disruption patterns 714 are overlapping due to the plurality of the mold gates 704.

For example, utilizing the encapsulant 710 with the mold gates 704 to horizontally encapsulate the integrated circuit 708 is a critical factor in producing the unexpected results of significantly reduced warpage. Warpage was discovered to unexpectedly drop from a coplanarity measurement of 237 microns, on a conventionally molded package, to a coplanarity measurement of 70 microns on the integrated circuit packaging system 700.

Reduced warpage enables the utilization of the encapsulant 710 and the mold gates 704 with 65 and 45 nanometer technology with the integrated circuit 708 die sizes of 18×18 to 24×24 mm. Further the thickness of the integrated circuit 708 can be reduced enabling 400 or 200 um thicknesses with better electrical performance, the encapsulant 710 compound can be a high dielectric constant molding compound (Hi-K EMC), the substrate 702 can be a 3-2-3/4-2-4 ABF BU, and the integrated circuit packaging system 700 dimensions can be 40×40 to 55×55 mm.

It has been discovered that utilizing the encapsulant 710 with the mold gates 704 to horizontally encapsulate the integrated circuit 708 is a critical factor in producing the unexpected results of significantly reduced warpage. It has further been discovered that utilizing the encapsulant 710 with the mold gates 704 to horizontally encapsulate the integrated circuit 708 is a critical factor in producing the unexpected results of significantly higher performance by reducing under-fill voids, die cracks, layer delamination, and under-fill interference ultimately reducing cost of production.

It has been yet further discovered that the side horizontal injection of the encapsulant 710 utilizing the mold gates 704 and producing the disruption patterns 714, decreases mechanical stress during the molding process and increases thermal performance by changing the profile of the integrated circuit packaging system 700. This further increases the performance and reduces defects by providing the encapsulant 710 flow-ability around the integrated circuit 708.

Figure 8:
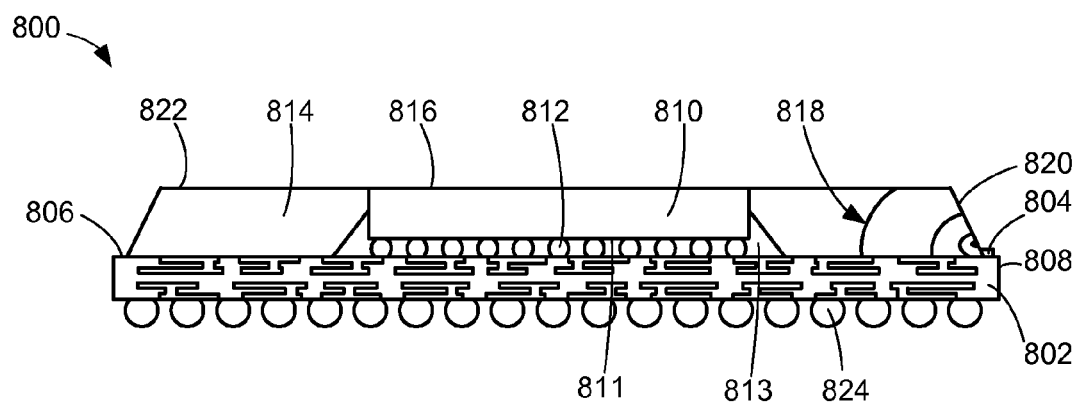
FIG. 8 is a cross-sectional view of an integrated circuit packaging system in a sixth embodiment of the present invention.

Referring now to FIG. 8, therein is shown a cross-sectional view of an integrated circuit packaging system 800 in a sixth embodiment of the present invention. The integrated circuit packaging system 800 can be shown having a substrate 802. The substrate 802 is defined as a singulated substrate structure capable of electrical connection, signal routing with internal signal to signal isolation, and providing structural support for components to be mounted thereto. The substrate 802 can be but is not limited to laminated plastic or ceramic.

A mold gate 804 can be formed on an upper surface 806 of the substrate 802. The mold gate 804 can be situated on the upper surface 806 and set back from a vertical side 808 of the substrate 802. The mold gate 804 does not extend past a perimeter of the substrate 802. A portion of the upper surface 806 can be exposed from the mold gate 804 between the mold gate 804 and the vertical side 808.

An integrated circuit 810 having an active side 811, can be mounted to the upper surface 806 of the substrate 802. The active side 811 is defined as a surface having active circuitry fabricated thereon. The integrated circuit 810 can be a flip-chip with interconnects 812 electrically connecting between the integrated circuit 810 and the substrate 802. The interconnects 812 can be a ball grid array, an array of conductive pillars, or asymmetrically arranged conductors.

An under-fill 813 can be formed between the integrated circuit 810 and the substrate 802 and around the interconnects 812. The under-fill 813 is defined as a liquid adhesive to control stress on the interconnects 812 from vibration, shock, coefficient of thermal expansion mismatch, or seal out moisture and is applied using a capillary flow process and allowed to wick under the integrated circuit 810.

An encapsulant 814 can be formed on the upper surface 806 of the substrate 802. The encapsulant 814 is defined as a structure that protects sensitive components from moisture, dust and other contamination providing a hermetic seal. The encapsulant 814 can encapsulate the under-fill 813 under the integrated circuit 810 and encapsulate the integrated circuit 810 leaving a top surface 816 exposed.

The encapsulant 814 can include physical characteristics of disruption patterns 818. The disruption patterns 818 can be physical characteristics of the encapsulant 814 formed by density differences in the encapsulant 814 or from grain alignment of the encapsulant 814. The disruption patterns 818 can expand toward the integrated circuit from the mold gate 804 with progressively larger diameters.

The encapsulant 814 can have a flat oblique side 820 extending from a top side 822 of the encapsulant 814 to the upper surface 806 of the substrate 802. The mold gate 804 can be flush with the flat oblique side 820 of the encapsulant 814. The encapsulant 814 can encapsulate around the under-fill 813 and directly injected to and around the integrated circuit 810 and enables transfer molding of the integrated circuit 810 through the mold gate 804.

For example, utilizing the encapsulant 814 with the mold gate 804 to horizontally encapsulate the integrated circuit 810 and the under-fill 813 is a critical factor in producing the unexpected results of significantly reduced warpage. Warpage was discovered to unexpectedly drop from a coplanarity measurement of 237 microns, on a conventionally molded package, to a coplanarity measurement of 70 microns on the integrated circuit packaging system 800.

Reduced warpage enables the utilization of the encapsulant 814 and the mold gate 804 with 65 and 45 nanometer technology with the integrated circuit 810 die sizes of 18×18 to 24×24 mm. Further the thickness of the integrated circuit 810 can be reduced enabling 400 or 200 um thicknesses with better electrical performance, the interconnects 812 can be lead free, the encapsulant 814 compound can be a high dielectric constant molding compound (Hi-K EMC), the substrate 802 can be a 3-2-3/4-2-4 ABF BU, and the integrated circuit packaging system 800 dimensions can be 40×40 to 55×55 mm.

It has been discovered that utilizing the encapsulant 814 with the mold gate 804 to horizontally encapsulate the integrated circuit 810 and the under-fill 813 is a critical factor in producing the unexpected results of significantly reduced warpage. It has further been discovered that utilizing the encapsulant 814 with the mold gate 804 to encapsulate the integrated circuit 810 and the under-fill 813 is a critical factor in producing the unexpected results of significantly higher performance by reducing under-fill voids, die cracks, layer delamination, the interconnects 812 cracks or delamination, and under-fill interference ultimately reducing cost of production.

It has been yet further discovered that the side horizontal injection of the encapsulant 814 utilizing the mold gate 804 and producing the disruption patterns 818, decreases mechanical stress during the molding process and increases thermal performance by changing the profile of the integrated circuit packaging system 800. This further increases the performance and reduces defects by providing the encapsulant 814 flow-ability around the under-fill 813 and around the integrated circuit 810. External interconnects 824 are connected below the substrate 802.

Figure 9:
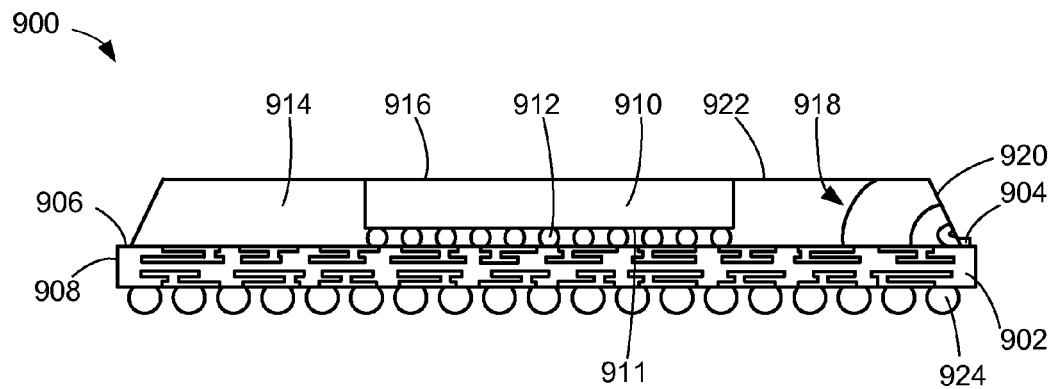
FIG. 9 is a cross-sectional view of an integrated circuit packaging system in a seventh embodiment of the present invention.

Referring now to FIG. 9, therein is shown a cross-sectional view of an integrated circuit packaging system 900 in a seventh embodiment of the present invention. The integrated circuit packaging system 900 can be shown having a substrate 902. The substrate 902 is defined as a singulated substrate structure capable of electrical connection, signal routing with internal signal to signal isolation, and providing structural support for components to be mounted thereto. The substrate 902 can be but is not limited to laminated plastic or ceramic.

A mold gate 904 can be formed on an upper surface 906 of the substrate 902. The mold gate 904 can be situated on the upper surface 906 and set back from a vertical side 908 of the substrate 902. The mold gate 904 does not extend past a perimeter of the substrate 902. A portion of the upper surface 906 can be exposed from the mold gate 904 between the mold gate 904 and the vertical side 908.

An integrated circuit 910 having an active side 911, can be mounted to the upper surface 906 of the substrate 902. The active side 911 is defined as a surface having active circuitry fabricated thereon. The integrated circuit 910 can be a flip-chip with interconnects 912 electrically connecting between the integrated circuit 910 and the substrate 902. The interconnects 912 can be a ball grid array, an array of conductive pillars, or asymmetrically arranged conductors.

An encapsulant 914 can be formed on the upper surface 906 of the substrate 902. The encapsulant 914 is defined as a structure that protects sensitive components from moisture, dust and other contamination providing a hermetic seal. The encapsulant 914 can encapsulate the interconnects 912 under the integrated circuit 910 and encapsulate the integrated circuit 910 leaving a top surface 916 exposed.

The encapsulant 914 can include physical characteristics of disruption patterns 918. The disruption patterns 918 can be physical characteristics of the encapsulant 914 formed by density differences in the encapsulant 914 or from grain alignment of the encapsulant 914. The disruption patterns 918 can expand toward the integrated circuit from the mold gate 904 with progressively larger diameters.

The encapsulant 914 can have a flat oblique side 920 extending from a top side 922 of the encapsulant 914 to the upper surface 906 of the substrate 902. The mold gate 904 can be flush with the flat oblique side 920 of the encapsulant 914. The encapsulant 914 can encapsulate around the interconnects 912 and directly injected to and under the integrated circuit 910 and enables transfer molding of the interconnects 912 through the mold gate 904.

For example, utilizing the encapsulant 914 with the mold gate 904 to horizontally encapsulate the integrated circuit 910 and the interconnects 912 is a critical factor in producing the unexpected results of significantly reduced warpage. Warpage was discovered to unexpectedly drop from a coplanarity measurement of 237 microns, on a conventionally molded package, to a coplanarity measurement of 70 microns on the integrated circuit packaging system 900.

Reduced warpage enables the utilization of the encapsulant 914 and the mold gate 904 with 65 and 45 nanometer technology with the integrated circuit 910 die sizes of 18×18 to 24×24 mm. Further the thickness of the integrated circuit 910 can be reduced enabling 400 or 200 um thicknesses with better electrical performance, the interconnects 912 can be lead free, the encapsulant 914 compound can be a high dielectric constant molding compound (Hi-K EMC), the substrate 902 can be a 3-2-3/4-2-4 ABF BU, and the integrated circuit packaging system 900 dimensions can be 40×40 to 55×55 mm.

It has been discovered that utilizing the encapsulant 914 with the mold gate 904 to horizontally encapsulate the integrated circuit 910 and the interconnects 912 is a critical factor in producing the unexpected results of significantly reduced warpage. It has further been discovered that utilizing the encapsulant 914 with the mold gate 904 to encapsulate the integrated circuit 910 and the interconnects 912 is a critical factor in producing the unexpected results of significantly higher performance by reducing under-fill voids, die cracks, layer delamination, the interconnects 912 cracks or delamination, and under-fill interference ultimately reducing cost of production.

It has been yet further discovered that the side horizontal injection of the encapsulant 914 utilizing the mold gate 904 and producing the disruption patterns 918, decreases mechanical stress during the molding process and increases thermal performance by changing the profile of the integrated circuit packaging system 900. This further increases the performance and reduces defects by providing the encapsulant 914 flow-ability through the interconnects 912 and around the integrated circuit 910. External interconnects 924 are connected below the substrate 902.

Figure 10:
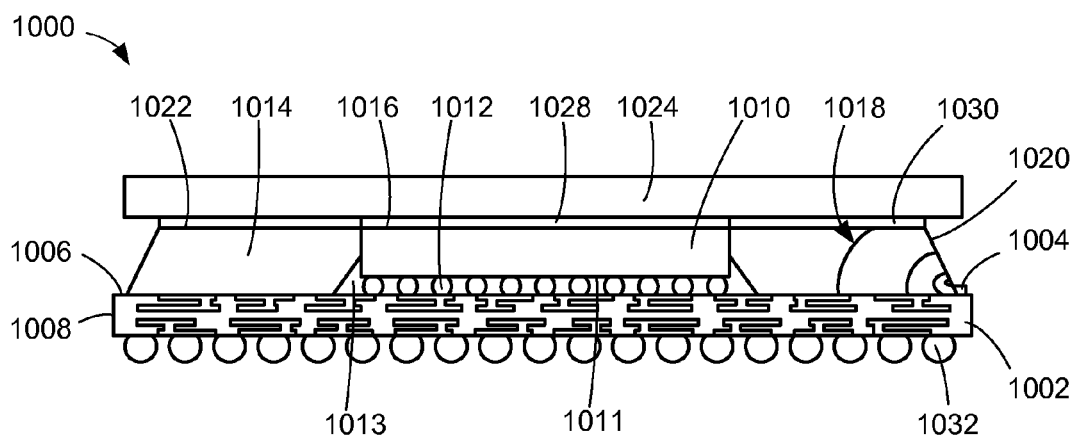
FIG. 10 is a cross-sectional view of an integrated circuit packaging system in an eighth embodiment of the present invention.

Referring now to FIG. 10, therein is shown a cross-sectional view of an integrated circuit packaging system 1000 in an eighth embodiment of the present invention. The integrated circuit packaging system 1000 can be shown having a substrate 1002. The substrate 1002 is defined as a singulated substrate structure capable of electrical connection, signal routing with internal signal to signal isolation, and providing structural support for components to be mounted thereto. The substrate 1002 can be but is not limited to laminated plastic or ceramic.

A mold gate 1004 can be formed on an upper surface 1006 of the substrate 1002. The mold gate 1004 can be situated on the upper surface 1006 and set back from a vertical side 1008 of the substrate 1002. The mold gate 1004 does not extend past a perimeter of the substrate 1002. A portion of the upper surface 1006 can be exposed from the mold gate 1004 between the mold gate 1004 and the vertical side 1008.

An integrated circuit 1010 having an active side 1011, can be mounted to the upper surface 1006 of the substrate 1002. The active side 1011 is defined as a surface having active circuitry fabricated thereon. The integrated circuit 1010 can be a flip-chip with interconnects 1012 electrically connecting between the integrated circuit 1010 and the substrate 1002. The interconnects 1012 can be a ball grid array, an array of conductive pillars, or asymmetrically arranged conductors.

An under-fill 1013 can be formed between the integrated circuit 1010 and the substrate 1002 and around the interconnects 1012. The under-fill 1013 is defined as a liquid adhesive to control stress on the interconnects 1012 from vibration, shock, coefficient of thermal expansion mismatch, or seal out moisture and is applied using a capillary flow process and allowed to wick under the integrated circuit 1010.

An encapsulant 1014 can be formed on the upper surface 1006 of the substrate 1002. The encapsulant 1014 is defined as a structure that protects sensitive components from moisture, dust and other contamination providing a hermetic seal. The encapsulant 1014 can encapsulate the under-fill 1013 under the integrated circuit 1010 and encapsulate the integrated circuit 1010 leaving a top surface 1016 exposed.

The encapsulant 1014 can include physical characteristics of disruption patterns 1018. The disruption patterns 1018 can be physical characteristics of the encapsulant 1014 formed by density differences in the encapsulant 1014 or from grain alignment of the encapsulant 1014. The disruption patterns 1018 can expand toward the integrated circuit from the mold gate 1004 with progressively larger diameters.

The encapsulant 1014 can have a flat oblique side 1020 extending from a top side 1022 of the encapsulant 1014 to the upper surface 1006 of the substrate 1002. The mold gate 1004 can be flush with the flat oblique side 1020 of the encapsulant 1014. The encapsulant 1014 can encapsulate around the under-fill 1013 and directly injected to and around the integrated circuit 1010 and enables transfer molding of the integrated circuit 1010 through the mold gate 1004.

For example, utilizing the encapsulant 1014 with the mold gate 1004 to horizontally encapsulate the integrated circuit 1010 and the under-fill 1013 is a critical factor in producing the unexpected results of significantly reduced warpage. Warpage was discovered to unexpectedly drop from a coplanarity measurement of 237 microns, on a conventionally molded package, to a coplanarity measurement of 70 microns on the integrated circuit packaging system 1000.

Reduced warpage enables the utilization of the encapsulant 1014 and the mold gate 1004 with 65 and 45 nanometer technology with the integrated circuit 1010 die sizes of 18×18 to 24×24 mm. Further the thickness of the integrated circuit 1010 can be reduced enabling 400 or 200 um thicknesses with better electrical performance, the interconnects 1012 can be lead free, the encapsulant 1014 compound can be a high dielectric constant molding compound (Hi-K EMC), the substrate 1002 can be a 3-2-3/4-2-4 ABF BU, and the integrated circuit packaging system 1000 dimensions can be 40×40 to 55×55 mm.

It has been discovered that utilizing the encapsulant 1014 with the mold gate 1004 to horizontally encapsulate the integrated circuit 1010 and the under-fill 1013 is a critical factor in producing the unexpected results of significantly reduced warpage. It has further been discovered that utilizing the encapsulant 1014 with the mold gate 1004 to encapsulate the integrated circuit 1010 and the under-fill 1013 is a critical factor in producing the unexpected results of significantly higher performance by reducing under-fill voids, die cracks, layer delamination, the interconnects 1012 cracks or delamination, and under-fill interference ultimately reducing cost of production.

It has been yet further discovered that the side horizontal injection of the encapsulant 1014 utilizing the mold gate 1004 and producing the disruption patterns 1018, decreases mechanical stress during the molding process and increases thermal performance by changing the profile of the integrated circuit packaging system 1000. This further increases the performance and reduces defects by providing the encapsulant 1014 flow-ability around the under-fill 1013 and around the integrated circuit 1010.

A heat spreader 1024 can be mounted to the top side 1022 of the encapsulant 1014 and the top surface 1016 of the integrated circuit 1010. The heat spreader 1024 can be attached to the integrated circuit 1010 with a thermal interference material 1028 that can be a thermally conductive adhesive. The heat spreader 1024 can be attached to the top side 1022 of the encapsulant 1014 with an adhesive 1030.

It has been discovered that utilizing the horizontal injection of the encapsulant 1014 with the mold gate 1004 is critical to realizing the unexpected result of enhanced heat dissipation, due to beneficial change in package profile, required for high power devices. It has been further discovered that utilizing the heat spreader 1024 along with the encapsulant 1014 horizontally injected over the mold gate 1004 and attached thereto with the thermal interference material 1028 and the adhesive 1030 is critical to achieving the unexpected result of greater flatness, reduced warpage, and heat dissipation. External interconnects 1032 are connected below the substrate 1002.

Figure 11:
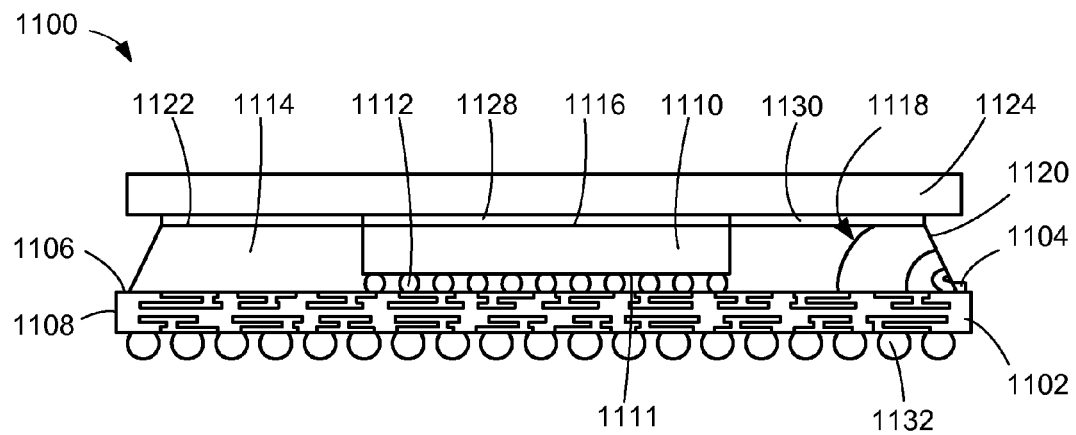
FIG. 11 is a cross-sectional view of an integrated circuit packaging system in a ninth embodiment of the present invention.

Referring now to FIG. 11, therein is shown a cross-sectional view of an integrated circuit packaging system 1100 in a ninth embodiment of the present invention. The integrated circuit packaging system 1100 can be shown having a substrate 1102. The substrate 1102 is defined as a singulated substrate structure capable of electrical connection, signal routing with internal signal to signal isolation, and providing structural support for components to be mounted thereto. The substrate 1102 can be but is not limited to laminated plastic or ceramic.

A mold gate 1104 can be formed on an upper surface 1106 of the substrate 1102. The mold gate 1104 can be situated on the upper surface 1106 and set back from a vertical side 1108 of the substrate 1102. The mold gate 1104 does not extend past a perimeter of the substrate 1102. A portion of the upper surface 1106 can be exposed from the mold gate 1104 between the mold gate 1104 and the vertical side 1108.

An integrated circuit 1110 having an active side 1111, can be mounted to the upper surface 1106 of the substrate 1102. The active side 1111 is defined as a surface having active circuitry fabricated thereon. The integrated circuit 1110 can be a flip-chip with interconnects 1112 electrically connecting between the integrated circuit 1110 and the substrate 1102. The interconnects 1112 can be a ball grid array, an array of conductive pillars, or asymmetrically arranged conductors.

An encapsulant 1114 can be formed on the upper surface 1106 of the substrate 1102. The encapsulant 1114 is defined as a structure that protects sensitive components from moisture, dust and other contamination providing a hermetic seal. The encapsulant 1114 can encapsulate the interconnects 1112 under the integrated circuit 1110 and encapsulate the integrated circuit 1110 leaving a top surface 1116 exposed.

The encapsulant 1114 can include physical characteristics of disruption patterns 1118. The disruption patterns 1118 can be physical characteristics of the encapsulant 1114 formed by density differences in the encapsulant 1114 or from grain alignment of the encapsulant 1114. The disruption patterns 1118 can expand toward the integrated circuit from the mold gate 1104 with progressively larger diameters.

The encapsulant 1114 can have a flat oblique side 1120 extending from a top side 1122 of the encapsulant 1114 to the upper surface 1106 of the substrate 1102. The mold gate 1104 can be flush with the flat oblique side 1120 of the encapsulant 1114. The encapsulant 1114 can encapsulate around the interconnects 1112 and directly injected to and under the integrated circuit 1110 and enables transfer molding of the interconnects 1112 through the mold gate 1104.

For example, utilizing the encapsulant 1114 with the mold gate 1104 to horizontally encapsulate the integrated circuit 1110 and the interconnects 1112 is a critical factor in producing the unexpected results of significantly reduced warpage. Warpage was discovered to unexpectedly drop from a coplanarity measurement of 237 microns, on a conventionally molded package, to a coplanarity measurement of 70 microns on the integrated circuit packaging system 1100.

Reduced warpage enables the utilization of the encapsulant 1114 and the mold gate 1104 with 65 and 45 nanometer technology with the integrated circuit 1110 die sizes of 18×18 to 24×24 mm. Further the thickness of the integrated circuit 1110 can be reduced enabling 400 or 200 um thicknesses with better electrical performance, the interconnects 1112 can be lead free, the encapsulant 1114 compound can be a high dielectric constant molding compound (Hi-K EMC), the substrate 1102 can be a 3-2-3/4-2-4 ABF BU, and the integrated circuit packaging system 1100 dimensions can be 40×40 to 55×55 mm.

It has been discovered that utilizing the encapsulant 1114 with the mold gate 1104 to horizontally encapsulate the integrated circuit 1110 and the interconnects 1112 is a critical factor in producing the unexpected results of significantly reduced warpage. It has further been discovered that utilizing the encapsulant 1114 with the mold gate 1104 to encapsulate the integrated circuit 1110 and the interconnects 1112 is a critical factor in producing the unexpected results of significantly higher performance by reducing under-fill voids, die cracks, layer delamination, the interconnects 1112 cracks or delamination, and under-fill interference ultimately reducing cost of production.

It has been yet further discovered that the side horizontal injection of the encapsulant 1114 utilizing the mold gate 1104 and producing the disruption patterns 1118, decreases mechanical stress during the molding process and increases thermal performance by changing the profile of the integrated circuit packaging system 1100. This further increases the performance and reduces defects by providing the encapsulant 1114 flow-ability through the interconnects 1112 and around the integrated circuit 1110.

A heat spreader 1124 can be mounted to the top side 1122 of the encapsulant 1114 and the top surface 1116 of the integrated circuit 1110. The heat spreader 1124 can be attached to the integrated circuit 1110 with a thermal interference material 1128 that can be a thermally conductive adhesive. The heat spreader 1124 can be attached to the top side 1122 of the encapsulant 1114 with an adhesive 1130.

It has been discovered that utilizing the horizontal injection of the encapsulant 1114 with the mold gate 1104 is critical to realizing the unexpected result of enhanced heat dissipation, due to beneficial change in package profile, required for high power devices. It has been further discovered that utilizing the heat spreader 1124 along with the encapsulant 1114 horizontally injected over the mold gate 1104 and attached thereto with the thermal interference material 1128 and the adhesive 1130 is critical to achieving the unexpected result of greater flatness, reduced warpage, and heat dissipation. External interconnects 1132 are connected below the substrate 1102.

Figure 12:
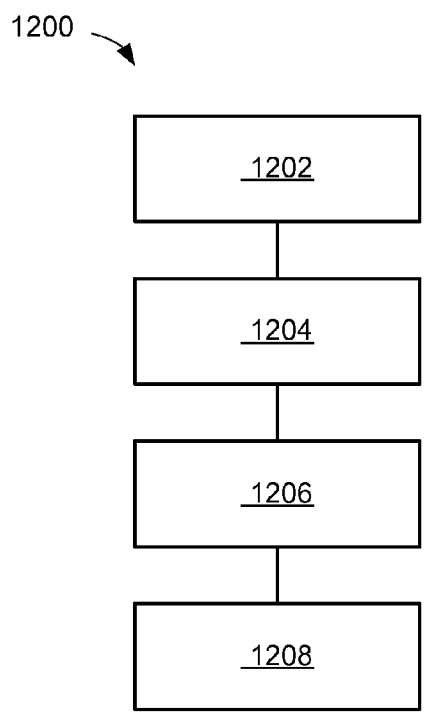
FIG. 12 is a flow chart of a method of manufacture of the integrated circuit packaging system in a further embodiment of the present invention.

Referring now to FIG. 12, therein is shown a flow chart of a method 1200 of manufacture of the integrated circuit packaging system in a further embodiment of the present invention. The method 1200 includes: providing a substrate in a block 1202; forming a mold gate on an upper surface of the substrate in a block 1204; mounting an integrated circuit to the substrate in a block 1206; and forming an encapsulant encapsulating the integrated circuit, the encapsulant having disruption patterns emanating from the mold gate and underneath a bottom plane of the integrated circuit in a block 1208.

Thus, it has been discovered that the integrated circuit packaging system and fan in interposer on lead of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   forming a mold gate on an upper surface of the substrate;
   mounting an integrated circuit to the substrate; and
   forming an encapsulant horizontally encapsulating the integrated circuit, the encapsulant having disruption patterns emanating from the mold gate and underneath a bottom plane of the integrated circuit, the disruption patterns having progressively larger diameters expanding from the mold gate toward the integrated circuit.

2. The method as claimed in claim 1 wherein forming the encapsulant includes forming the encapsulant with the mold gate encompassing a corner of the encapsulant and extending beyond the encapsulant in two axes.

3. The method as claimed in claim 1 wherein forming the encapsulant includes forming the encapsulant with the mold gate in direct contact with only a single side of the encapsulant and extending past a corner of the encapsulant.

4. The method as claimed in claim 1 wherein forming the encapsulant includes forming the encapsulant with the mold gate in direct contact with a side of the encapsulant and not extending past a corner of the encapsulant.

5. The method as claimed in claim 1 wherein forming the encapsulant includes forming the encapsulant with the mold gate extending past multiple corners of the encapsulant.

6. A method of manufacture of an integrated circuit packaging system comprising:
   providing a substrate;

forming a mold gate on an upper surface of the substrate;
mounting an integrated circuit to the substrate;
forming an encapsulant horizontally encapsulating the integrated circuit, the encapsulant having disruption patterns emanating from the mold gate and underneath a bottom plane of the integrated circuit, the disruption patterns having progressively larger diameters expanding from the mold gate toward the integrated circuit, and a flat side in direct contact with the mold gate; and
connecting external interconnects below the substrate.

7. The method as claimed in claim 6 further comprising attaching a heat spreader to a top side of the encapsulant.

8. The method as claimed in claim 6 further comprising forming an under-fill between the integrated circuit and the substrate.

9. The method as claimed in claim 6 wherein forming the encapsulant includes forming the encapsulant having the disruption patterns overlapping.

10. The method as claimed in claim 6 further comprising attaching a heat spreader to the integrated circuit with a thermal interference material.

\* \* \* \* \*